US012641743B2

(12) United States Patent
Hain et al.

(10) Patent No.: US 12,641,743 B2
(45) Date of Patent: May 26, 2026

(54) SWITCH MODULE FOR AN INVERTER, INVERTER WITH SEVERAL SUCH SWITCH MODULES AND VEHICLE WITH THE INVERTER

(71) Applicant: ZF Friedrichshafen AG, Friedrichshafen (DE)

(72) Inventors: Stefan Hain, Speichersdorf (DE); Ake Ewald, Bayreuth (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 568 days.

(21) Appl. No.: 18/166,401

(22) Filed: Feb. 8, 2023

(65) Prior Publication Data

US 2023/0301008 A1 Sep. 21, 2023

(30) Foreign Application Priority Data

Feb. 9, 2022 (DE) ...................... 10 2022 201 329.8

(51) Int. Cl.
*H05K 7/14* (2006.01)
*H02M 7/00* (2006.01)
*H05K 7/20* (2006.01)

(52) U.S. Cl.
CPC ........ *H05K 7/14339* (2022.08); *H02M 7/003* (2013.01); *H05K 7/14329* (2022.08); *H05K 7/209* (2013.01)

(58) Field of Classification Search
CPC .............. H05K 7/14329; H05K 7/209; H05K 7/20927; H05K 1/181; H05K 7/14339;
(Continued)

(56) References Cited

U.S. PATENT DOCUMENTS 8,693,193 B2 * 4/2014 Ishibashi ................ H05K 7/209
361/689
9,148,946 B1 * 9/2015 Singh ................... H05K 7/2089
(Continued)

FOREIGN PATENT DOCUMENTS

DE 10 2012 206 271 A1 10/2013

OTHER PUBLICATIONS

Office Action issued in corresponding German Patent Application No. 10 2022 201 329.8, dated Sep. 28, 2022 (10 pages).

*Primary Examiner* — Adam B Dravininkas
(74) *Attorney, Agent, or Firm* — Crowell & Moring LLP

(57) ABSTRACT

A switch module for an inverter includes a high-side switch and a low-side switch, each of which has at least one semiconductor switch, wherein the semiconductor switches are attached to a flat substrate; a DC input connection with a positive DC input contact and a negative DC input contact; an AC output connection for outputting an AC phase current of a multi-phase AC output, which is generated by activating the high-side switch and low-side switch on the basis of the DC input; a micro-heat sink that has a coolant intake, a coolant outlet, and a connecting cooling channel structure between the coolant intake and the coolant outlet; wherein the micro-heat sink is designed such that numerous micro-heat sinks, each of which are dedicated to one of numerous switch modules in the inverter, can be releasably connected to one another for fluid exchange at their respective coolant intake and/or coolant outlet.

19 Claims, 7 Drawing Sheets

(58) Field of Classification Search
CPC ..... H01L 23/473; H02M 7/003; H02M 1/327;
H02M 1/32; H02M 7/5387; B60L
2210/40
See application file for complete search history.

(56) References Cited

U.S. PATENT DOCUMENTS

| | | | |
|---|---|---|---|
| 2005/0162875 A1* | 7/2005 | Rodriguez | H05K 7/14322 |
| | | | 363/68 |
| 2009/0147479 A1* | 6/2009 | Mori | H01L 23/3735 |
| | | | 361/699 |
| 2012/0188712 A1* | 7/2012 | Ishibashi | H01L 23/473 |
| | | | 361/688 |
| 2015/0097281 A1* | 4/2015 | Adachi | H01L 23/473 |
| | | | 257/714 |
| 2021/0313296 A1* | 10/2021 | Raimann | H01L 25/072 |

* cited by examiner

SWITCH MODULE FOR AN INVERTER, INVERTER WITH SEVERAL SUCH SWITCH MODULES AND VEHICLE WITH THE INVERTER

CROSS-REFERENCE TO RELATED APPLICATION

This application claims priority to German Application No. DE 10 2022 201 329.8, filed on Feb. 9, 2022, the entirety of which is hereby fully incorporated by reference herein.

FIELD

The invention relates to a switch module for an inverter designed for supplying electricity to an electric drive in an electric vehicle or hybrid vehicle. The invention also relates to an inverter with numerous such switch modules.

BACKGROUND

There are purely electric vehicles and hybrid vehicles in the prior art that are powered exclusively or partially by one or more electric machines functioning as the drive assembly. To supply the electric machines in these electric or hybrid vehicles with electricity, the electric and hybrid vehicles contain electric energy storage units, in particular rechargeable batteries. These batteries are DC power sources, while the electric machines normally require AC power. For this reason, a power electronics unit with a so-called inverter is normally interconnected between the battery and the electric machine in an electric or hybrid vehicle.

These inverters normally comprise semiconductor switches, which produce or interrupt electrical connections, depending on the phasing. The semiconductor switches are normally formed by transistors. The semiconductor switches can be in the form of switch modules, each of which comprises a half bridge. Each half bridge comprises a high-side switching setting (hereinafter, "high-side") with a high electrical potential and a low-side switching setting (hereinafter, "low-side") with a lower electrical potential. The high side and low side can each comprise one or more individual or semiconductor switches that are connected in parallel.

These semiconductor switches can withstand the switching frequency and the switching current. They become quite warm when in operation, however, and must therefore be placed appropriately for their use, and cooled. Inverters are known from the prior art in which one heat sink is use to for dissipation of the heat generated in numerous switch modules. In some configurations, this may not be sufficient, such that the individual semiconductor switches may overheat. Furthermore, this cooling concept has disadvantages with regard to the scalability of the switch modules or the inverter. By way of example, a new heat sink is needed whenever the number or arrangement of the switch modules in the inverter changes.

SUMMARY

An object of the present disclosure is to create a switch module for an inverter that can be easily scaled and can thus be used in inverters of different designs.

This object is achieved by a switch module, an inverter, and a vehicle according to the present disclosure. Preferred embodiments of the present disclosure can be derived from the descriptions of the drawings.

The present disclosure relates to a switch module used in an inverter for operating an electric drive in an electric vehicle and/or a hybrid vehicle. The switch module is in the form of a half bridge and comprises a high-side switch and a low-side switch, each of which has one or more semiconductor switches connected in parallel. The semiconductor switches can be insulated-gate bipolar transistors (IGBTs) or metal-oxide-semiconductor field-effect transistors (MOS-FETs). The fundamental material used for the semiconductor switches can be a conventional semiconductor material such as silicon or so-called wide bandgap semiconductors such as silicon carbide (SiC) or gallium nitride (GaN). These types of semiconductor switches are comparatively well suited for low-loss and quick switching, even with high current levels.

The semiconductor switches may be attached to a flat substrate. The substrate can be a DBC (Direct Bonded Copper) substrate, AMB (Active Metal Brazed) substrate, or IMS (Insulated Metal substrate). The semiconductor switches are placed on a first side of the substrate.

The substrate is preferably rectangular, in particular in the form of a flat, plate-like rectangle, with two pairs of side edges. The substrate can also be square. If the substrate is a DBC substrate, it comprises a first and second metal layer with an insulating layer therebetween, and the semiconductor switches are placed on the first metal layer. The heat sink is preferably attached to the second metal layer.

The switch module also comprises a DC input connection with a positive DC input contact and a negative DC input contact. The DC input connection is configured to receive a DC input (direct current) from a DC power source in the high-side switch and the low-side switch. The DC input is converted to a multi-phase AC output (alternating current) by the activation of the high-side switch and low-side switch. The switch module also comprises an AC output connection for outputting one of numerous AC phases in the multi-phase AC output. The half bridge in the switch module is thus dedicated to the AC phase. There can be numerous switch modules in the inverter for generating numerous AC phases, in which there can be one or more dedicated switch modules connected in parallel for each AC phase.

The switch module also comprises its own micro-heat sink for dissipating the heat generated in the switch module, in particular in the semiconductor switches subjected to high current levels. The micro-heat sink has a coolant intake, a coolant outlet, and a connecting cooling channel structure therebetween. The cooling channel structure can comprise numerous cooling channels or cooling lines running through the interior of the switch module in order to obtain the largest possible cooling surface, i.e. the entirety of the surface area where the micro-heat sink is thermally coupled to the other heat generating components in the switch module. A coolant, e.g. water, flows through the cooling channels. The coolant is preferably supplied to a main coolant intake in the inverter. The coolant then reaches the coolant intakes for the individual switch modules through a main distributor line. Heat is removed in the cooling channel structure for the respective switch modules by the coolant from the environment, i.e. the components of the switch module surrounding the cooling channel structure. The coolant heated in this manner is conveyed back to the main distributor line through the coolant outlet in the respective switch module, and exits the inverter, preferably through a main coolant outlet, at the end of the cooling circuit.

The micro-heat sink is designed according to the present disclosure such that numerous micro-heat sinks, each of which is dedicated to one or numerous switch modules in the inverter, can be releasably connected to one another at their respective coolant intakes and/or coolant outlets to form a cooling circuit. This means that when the numerous switch modules are installed, the various micro-heat sinks can be joined to one another at the coolant intakes or at the coolant outlets, and they can also be disconnected from one another, if the switch modules are to be rearranged. This is particularly advantageous with regard to obtaining a greater scalability and more effective cooling of the inverter, because numerous switch modules can be combined in a flexible manner, while an effective cooling of the semiconductor switches can still be obtained independently of the number and arrangement of the switch modules as a result of the micro-heat sinks in each switch module.

According to one embodiment, the cooling channel structure has a distributor segment running perpendicular to a main plane of the switch module, which is defined by the flat substrate. The main plane is parallel to the largest surface of the flat, preferably multi-layered substrate. The distributor segment connects the coolant intake and/or coolant outlet to the cooling channels. In particular, the distributor segment distributes the coolant to the cooling channels, such that heat is dissipated at numerous locations in the switch module.

According to another embodiment, the cooling channel structure contains one or more cooling channels that are parallel to the main plane of the switch module, which is defined by the flat substrate. This enlarges the cooling surface area of the micro-heat sink particularly effectively, and thus improves the cooling effect.

According to another embodiment, the switch module contains a separate intermediate circuit capacitor that is designed to reduce interference signals in a DC voltage from the DC power source. Because each switch module has a separate dedicated intermediate circuit capacitor, the DC voltage can be particularly effectively stabilized as the input for the semiconductor switches.

According to another embodiment, numerous DC intermediate circuit capacitors, each of which are dedicated to one of numerous switch modules, can be electrically connected to one another. The DC intermediate circuit capacitors are preferably connected in parallel to one another, such that their positive inputs are connected to one another and their negative inputs are connected to one another. This results in switch modules that each comprise a separate DC intermediate circuit capacitor. The voltage stabilizing property is improved for each individual half bridge in the inverter in this manner.

According to another embodiment, the cooling channel structure extends directly along the intermediate circuit capacitor, in particular between the substrate and the intermediate circuit capacitor. The heat generated in the intermediate circuit capacitor and the semiconductor switches on the substrate can be effectively dissipated in this manner.

According to another embodiment, the switch module has a separate, dedicated driver printed circuit board. This is of particular advantage with regard to greater scalability and more effective cooling of the inverter. The switch modules, along with the driver printed circuit boards, can first be specified in a modular manner, and combined with one another depending on the available structural space for the inverter and the demands placed on the electric drive with regard to power output.

According to another embodiment, the cooling channel structure extends directly along the driver printed circuit board, in particular between the substrate and the driver printed circuit board. Consequently, the driver printed circuit boards for the individual switch modules can be effectively cooled, thus improving the heat dissipation throughout the inverter.

According to another embodiment, a distributor segment in the cooling channel structure extends at an edge area of the driver printed circuit board, in a direction perpendicular to a main plane of the switch module, which is defined by the flat substrate. Preferably, numerous cooling levels of the cooling channel structure extend in the switch module from the distributor segment, parallel to the main plane. The cooling surface area in the switch module can be enlarged in this manner.

According to another embodiment, the switch module contains an AC busbar for conveying the AC phase to the electric drive in the electric vehicle or hybrid vehicle, and numerous AC busbars, each of which are dedicated to one of numerous switch modules in the inverter and are assigned to the same AC phase of the AC output, can be electrically connected to one another or are formed integrally with one another. This reduces the number of AC busbars for each half bridge, each of which are assigned to one of the numerous phases of the output current, such that the overall inverter can have a compact design.

According to another embodiment, the cooling channel structure extends directly along the AC busbar. This allows the AC busbar to be cooled directly. This further improves the functionality of the inverter.

The present disclosure also relates to an inverter with numerous of the switch modules described above, each of which is assigned to one of the numerous phases of an output alternating current. The present disclosure also relates to a vehicle with an inverter of this type. This also results in the advantages already described in conjunction with the switch module according to the present disclosure for the inverter according to the present disclosure and the vehicle according to the present disclosure.

The following description and drawings disclose preferred exemplary embodiments of the present disclosure.

DETAILED DESCRIPTION

Figures 1A, 1B, 1C:
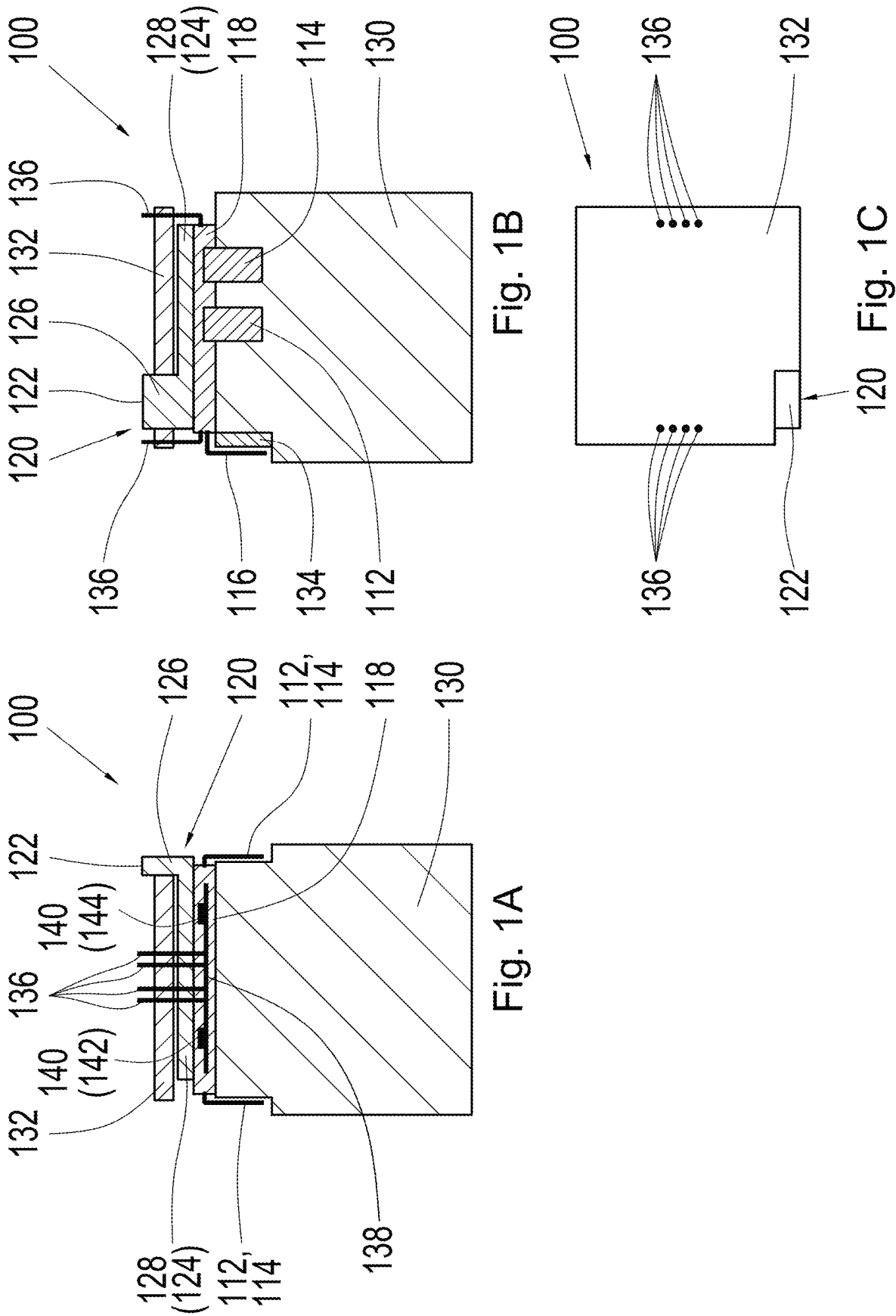
FIGS. 1A, 1B, and 1C show three views of a schematic illustration of a switch module according to an embodiment.

The same or corresponding components or areas in the drawings have the same or corresponding reference symbols. The description relates equally to all of the figures.

FIGS. 1A-C show three views of a schematic illustration of a switch module 100 according to an embodiment. The switch module 100 is shown in a first side view in FIG. 1A. The switch module 100 is shown in a second side view in FIG. 1B, which is turned 90° in relation to the first side view. The switch module 100 is shown from above in FIG. 1C. The switch module comprises numerous components, which are connected to one another in a vertical structure. The switch module 100 thus comprises a casting compound 118, obtained in that a substrate 138 populated with numerous semiconductor switches 140 is coated with an injection molding material. The substrate 138, extends horizontally along a main plane. The semiconductor switches 140 form a half bridge in the switch module 100, which has a high-side switch 142 and a low-side switch 144, each of which comprise one or more semiconductor switches 140 connected in parallel. The semiconductor switches 140 can be metal-oxide-semiconductor field-effect transistors (MOS-FETs) or insulated-gate bipolar transistors (IGBTs). The fundamental material used for the semiconductor switches 140 can be a so-called wide bandgap semiconductors such as silicon carbide (SiC) or gallium nitride (GaN).

To supply a DC input provided by a DC power source (e.g. a battery), not shown herein, to the semiconductor switches 140, there is a DC input connection with a positive DC input contact 112 and a negative DC input contact 114 in the switch module, which are attached to the casting compound 118. The DC input is converted into one of numerous phases of a multi-phase AC output current by targeted activation of the semiconductor switches 140 in the switch module. As described below in greater detail, the inverter comprises numerous switch modules 100 and therefore numerous half bridges, and each half bridge is assigned to one phase of the AC output. An AC output connection 116 is formed and attached to the casting compound 118, to output the phase current to an electric drive. As shown in FIG. 1B, there is an AC busbar 134, which forwards the phase current from the AC output connection 116 to electric drive that is to be supplied with electricity.

Control signals are generated by electronic components on the driver printed circuit board 132 for activating the semiconductor switches 140. The driver printed circuit board 132 is placed above the casting compound 118, and dedicated to the switch module 100. Numerous signal lines 136 connect control terminals (e.g. gate terminals) in the semiconductor switches 140 to the driver printed circuit board 132. An intermediate circuit capacitor 130, which is also dedicated to the switch module 100, is located beneath the casting compound 118. The intermediate circuit capacitor 130 connected in parallel to the half bridge in the switch module 100.

To dissipate the heat generated by the semiconductor switches 140 subjected to high current levels and other electric and electronic components in the switch module 100 when the inverter is in operation, a micro-heat sink 120 is placed in the switch module 100. The micro-heat sink 120 is part of a heat sink for the entire inverter, and dedicated to the switch module 100. The micro-heat sink 120 comprises a coolant intake 122, a coolant outlet, and a connecting cooling channel structure 124 therebetween. The cooling channel structure 124 comprises a distributor segment 126 that runs perpendicular to the main plane of the substrate 138, and a cooling channel 128 that runs parallel to the main plane of the substrate 138. The distributor segment 126 is located in an edge region of the switch module 100 (see FIG. 1C). The cooling channel 128 is located between the driver printed circuit board 132 and the casting compound 118. A coolant (e.g. water) is supplied to the coolant intake 122 and flows through the distributor segment 126 to the cooling channel 128. The coolant is thermally coupled to a casting compound 118 there, and thus also with the semiconductor switches 140 that are subjected to electricity, such that a heat exchange takes place in which the semiconductor switches 140 are cooled. The heated coolant then flows to the coolant outlet, and exits the micro-heat sink 120.

Figures 2A, 2B, 2C:
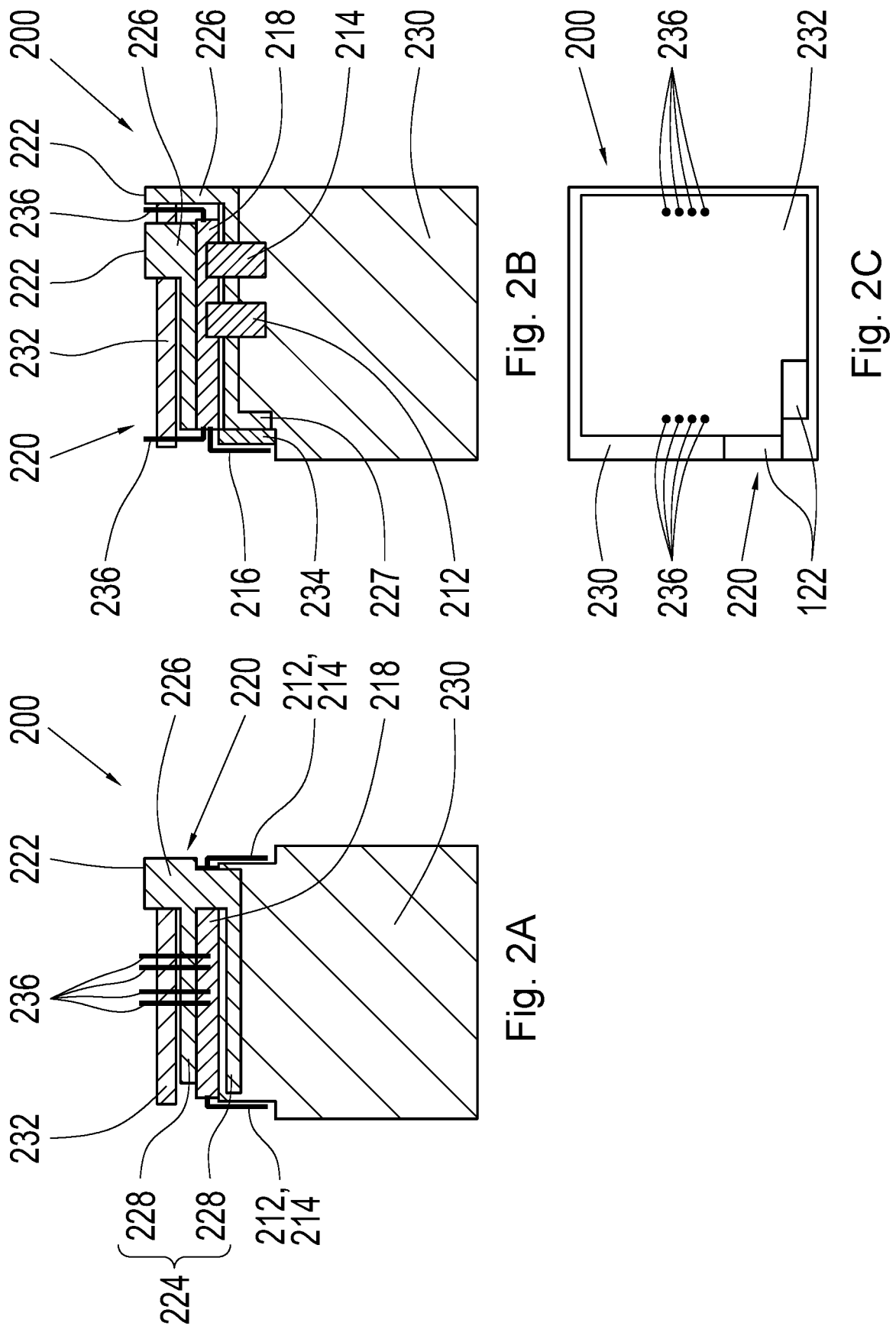
FIGS. 2A, 2B, and 2C show three views of a schematic illustration of a switch module according to another embodiment.

FIGS. 2A-C show three views of a schematic illustration of a switch module 200 according to another embodiment. The switch module 200 is shown in a first side view in FIG. 2A. The switch module 200 is shown in a second side view in FIG. 2B, which is rotated 90° in relation to the first side view. The switch module 200 is shown from above in FIG. 2C. The switch module 200 comprises, as with the embodiment shown in FIGS. 1A-C, numerous components, which are connected to one another in a vertical structure. The switch module 200 thus has a casting compound 218, formed in the same manner as that in the embodiment shown in FIGS. 1A-C. There is a DC input connection with a positive DC input contact 212 and a negative DC input contact 214 in the switch module 200, which are attached to the casting compound 218. An AC output connection 216 is also attached to the casting compound 218. As shown in FIG. 2B, there is an AC busbar 234 in the switch module 200.

A driver printed circuit board 232 is located above the casting compound 218, and dedicated to the switch module 200. Numerous signal lines 236 are configured to connect control terminals (e.g. gate terminals) in the semiconductor switches to the driver printed circuit board 232.

There is also a micro-heat sink 220 in the embodiment shown in FIGS. 2A-C. The micro-heat sink 220 is also part of the heat sink for the entire inverter, and dedicated to the switch module 200. The micro-heat sink 220 comprises a coolant intake 222, a coolant outlet and a connecting coolant structure 224 therebetween. The cooling channel structure 224 also comprises a distributor segment 226 that is perpendicular to the main plain of the substrate. Unlike in the embodiment shown in FIGS. 1A-C, the cooling channel structure 224 comprises two cooling channels 228, which extend from the distributor segment 226 parallel to the main plane of the substrate and are spaced apart vertically. A first cooling channel 228 is located between the driver printed circuit board 232 and the casting compound 218. A second cooling channel 228 is located between the casting compound 218 and the intermediate circuit capacitor 230. A coolant (e.g. water) is supplied to the coolant intake 222 and flows through the distributor segment 226 to the cooling channels 228. The coolant is thermally coupled to the casting compound 218 there and thus to the semiconductor switches subjected to electricity, such that a heat exchange takes place in which the semiconductor switches are cooled. The heated coolant then flows to the coolant outlet and exits the micro-heat sink 220.

Figures 3A, 3B, 3C:
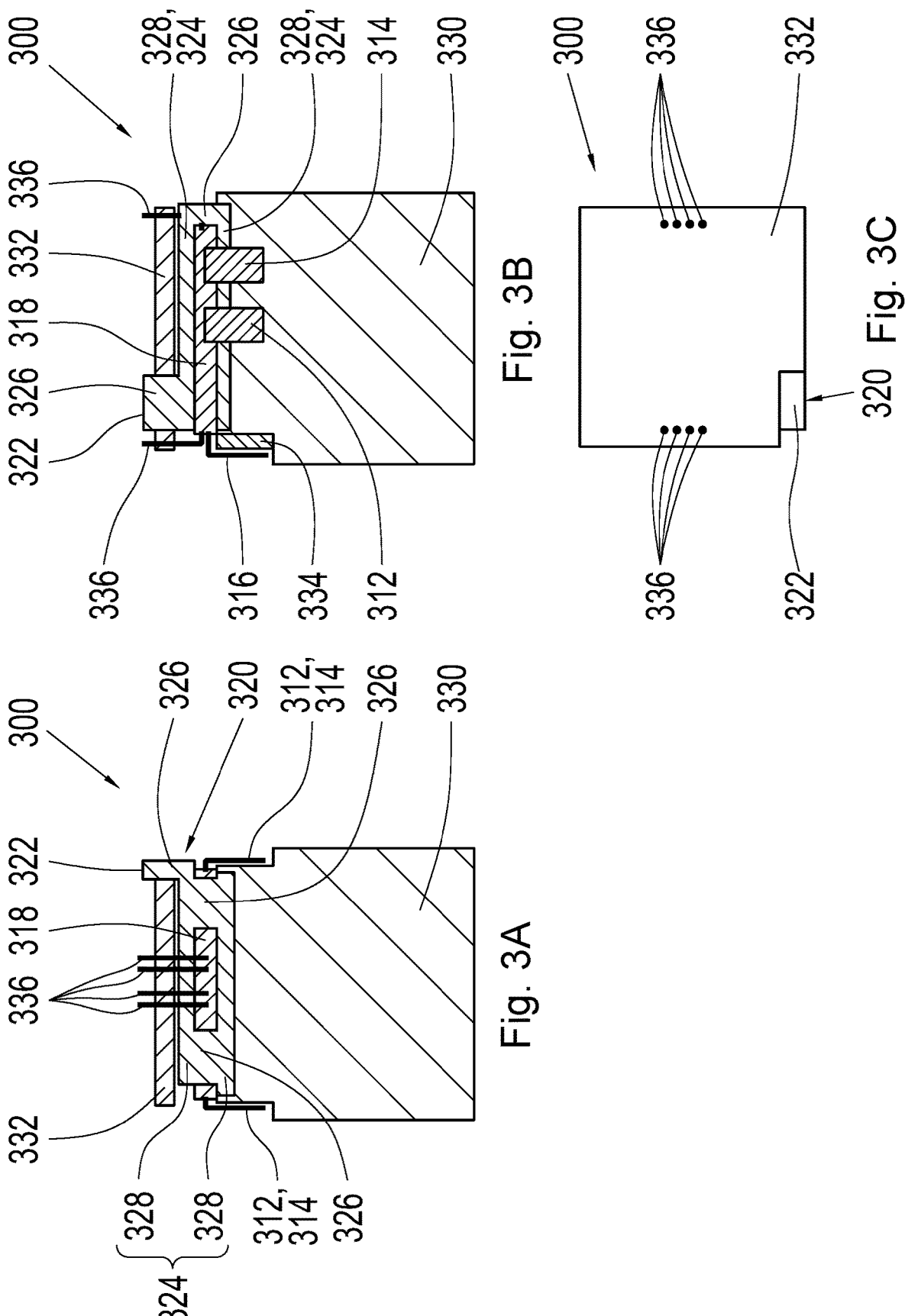
FIGS. 3A, 3B, and 3C show three views of a schematic illustration of a switch module according to another embodiment.

FIGS. 3A-C show three views of a schematic illustration of a switch module 300 according to another embodiment. The switch module 300 is shown in a first side view in FIG. 3A. The switch module 300 is shown in a second side view in FIG. 3B, which is rotated 90° in relation to the first side view. The switch module 300 is shown from above in FIG. 3C. The switch module 300 comprises, as with the embodiment shown in FIGS. 2A-C, numerous components, which are connected to one another in a vertical structure. The switch module 300 thus has a casting compound 318, formed in the same manner as that in the embodiment shown in FIGS. 2A-C. There is a DC input connection with a positive DC input contact 312 and a negative DC input contact 314 in the switch module 300, which are attached to the casting compound 318. An AC output connection 316 is also attached to the casting compound 318. As shown in FIG. 3B, there is an AC busbar 334 in the switch module 300.

A driver printed circuit board 332 is located above the casting compound 318, and dedicated to the switch module 300. Numerous signal lines 336 are configured to connect control terminals (e.g. gate terminals) in the semiconductor switches to the driver printed circuit board 332.

There is also a micro-heat sink 320 in the embodiment shown in FIGS. 3A-C. The micro-heat sink 320 is also part of the heat sink for the entire inverter, and dedicated to the switch module 300. The micro-heat sink 320 comprises a coolant intake 322, a coolant outlet and a connecting coolant structure 324 therebetween. The cooling channel structure 324 comprises two distributor segments 326 that are perpendicular to the main plain of the substrate and spaced apart horizontally. As in the embodiment shown in FIGS. 2A-C, the cooling channel structure 324 comprises two cooling channels 328, which extend from the distributor segment 326 parallel to the main plane of the substrate and are spaced apart vertically. A first cooling channel 328 is located between the driver printed circuit board 332 and the casting compound 318. A second cooling channel 328 is located between the casting compound 318 and the intermediate circuit capacitor 330. A coolant (e.g. water) is supplied to the coolant intake 322 and flows through the distributor segment 326 to the cooling channels 328. The coolant is thermally coupled to the casting compound 318 there and thus to the semiconductor switches subjected to electricity, such that a heat exchange takes place in which the semiconductor switches are cooled. The heated coolant then flows to the coolant outlet and exits the micro-heat sink 320.

Figures 4A, 4B, 4C:
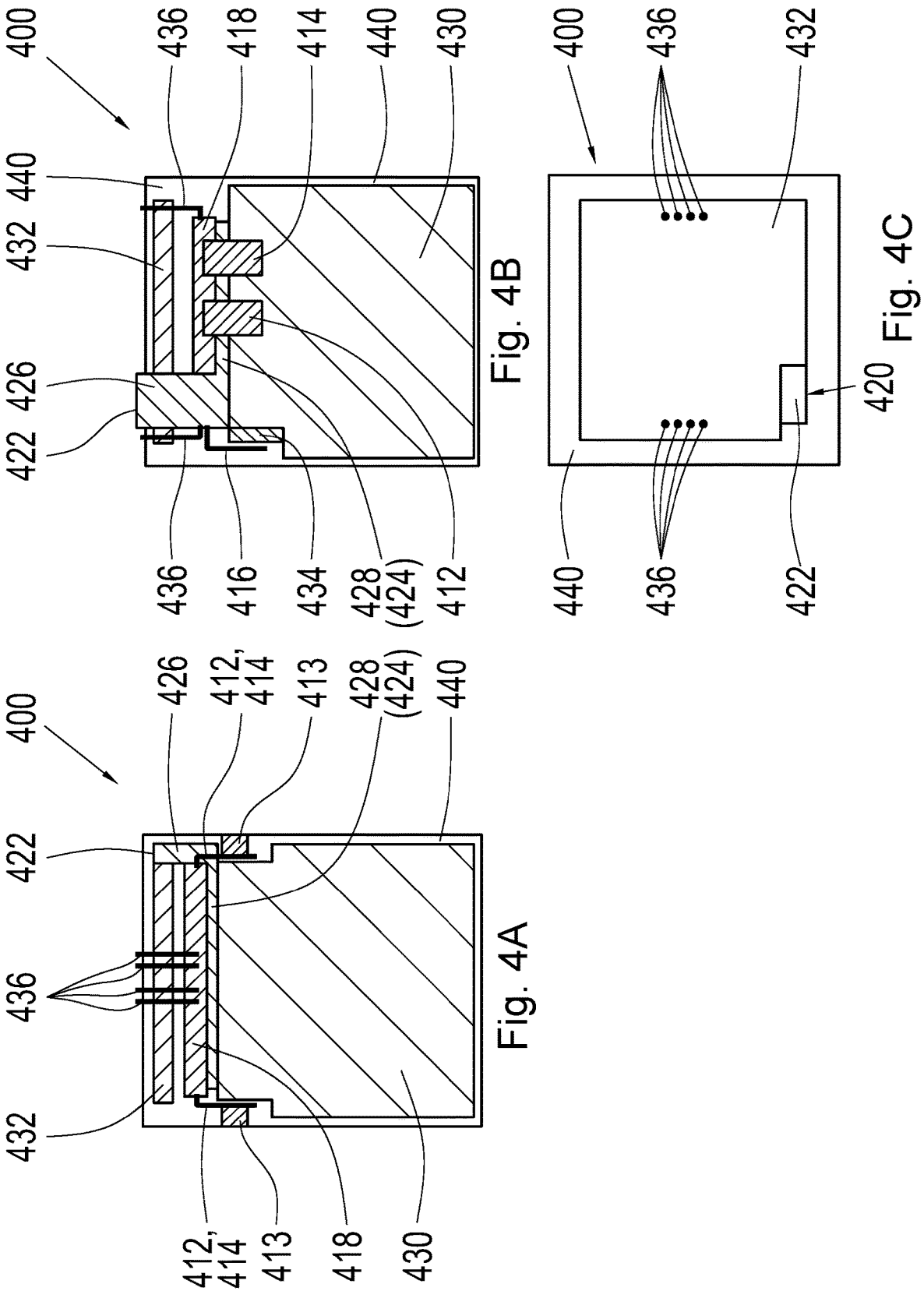
FIGS. 4A, 4B, and 4C show three views of a schematic illustration of a switch module according to another embodiment.

FIGS. 4A-C show three views of a schematic illustration of a switch module 400 according to another embodiment. The switch module 400 is shown in a first side view in FIG. 4A. The switch module 400 is shown in a second side view in FIG. 4B, which is rotated 90° in relation to the first side view. The switch module 400 is shown from above in FIG. 4C. The switch module 400 comprises, as with the embodiment shown in FIGS. 1A-C, numerous components, which are connected to one another in a vertical structure. The switch module 400 thus has a casting compound 418, formed in the same manner as that in the embodiment shown in FIGS. 1A-C. There is a DC input connection with a positive DC input contact 412 and a negative DC input contact 414 in the switch module 400, which are attached to the casting compound 418. An AC output connection 416 is also attached to the casting compound 418. As shown in FIG. 4B, there is an AC busbar 434 in the switch module 400.

A driver printed circuit board 432 is located above the casting compound 418, and dedicated to the switch module 400. Numerous signal lines 436 are configured to connect control terminals (e.g. gate terminals) in the semiconductor switches to the driver printed circuit board 432.

There is also a micro-heat sink 420 in the embodiment shown in FIGS. 4A-C. The micro-heat sink 420 is also part of the heat sink for the entire inverter, and dedicated to the switch module 400. The micro-heat sink 420 comprises a coolant intake 422, a coolant outlet and a connecting coolant structure 424 therebetween. The cooling channel structure 424 also comprises a distributor segment 426 that is perpendicular to the main plain of the substrate and a cooling channel 428 extending from the distributor segment 426, parallel to the main plane of the substrate. Unlike in the embodiment shown in FIGS. 1A-C, the cooling channel 428 in FIGS. 4A-C is located between the casting compound 418 and the intermediate circuit capacitor 430. A coolant (e.g. water) is supplied to the coolant intake 422 and flows through the distributor segment 426 to the cooling channels 428. The coolant is thermally coupled to the casting compound 418 there and thus to the semiconductor switches subjected to electricity, such that a heat exchange takes place in which the semiconductor switches are cooled. The heated coolant then flows to the coolant outlet and exits the micro-heat sink 420.

Figures 5A, 5B:
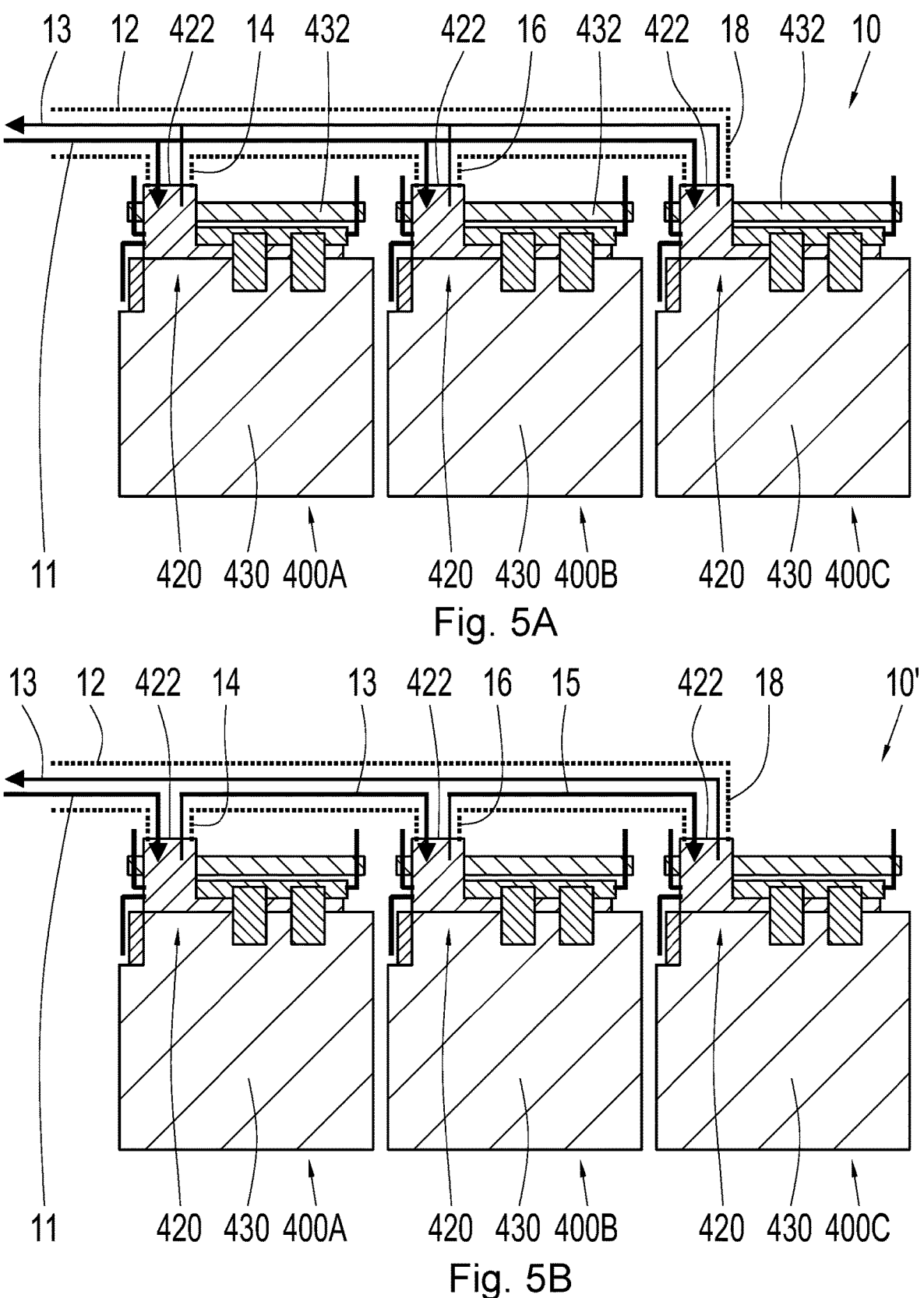
FIGS. 5A and 5B show schematic illustrations of an inverter according to two different embodiments in which numerous switch modules are arranged in a sequence.

FIGS. 5A-B each show a schematic illustration of an inverter 10, 10' according to an embodiment. Numerous switch modules 400A-C according to the embodiment shown in FIGS. 4A-C, in this case three, are arranged in a sequence in both embodiments. The present disclosure is not limited thereto, however. In general, all of the embodiments of switch modules disclosed in the framework of this disclosure can be used. By way of example, numerous switch modules according to two or even more embodiments can be used in an inverter. Each of the switch modules 400A-C is assigned to one of numerous (e.g. 3) phase currents in the multi-phase output current (AC output).

The inverter 10, 10' has a main distributor line 12, which has three distributor outputs 14, 16, 18. The distributor outputs 14, 16, 18 are each connected to the coolant intake 422 in the respective switch module 400A-C. The coolant can thus travel from the main distributor line 12 into the micro-heat sink 420 (see FIGS. 4A-C) for each switch module 400A-C. An arrow 11 indicates the direction the coolant flows from the main distributor line 11 into the respective micro-heat sinks 420. Another arrow 13 indicates the direction of flow for the coolant back to the main distributor line 12 after the heat exchange with the heat-generating components in the switch modules 400A-C that are thermally coupled to the micro-heat sink 420.

The embodiments in FIGS. 5A-B differ from one another with regard to the direction of flow of the coolant in the inverters 10, 10'. In the embodiment shown in FIG. 5A, the coolant flows from the main distributor line 12 directly into the respective micro-heat sink 420, and then directly back to the main distributor line 12 from the micro-heat sinks 420 after the heat exchange in the respective switch modules 400A-C. In the embodiment shown in FIG. 5B, the coolant first flows from the main distributor line 12 directly into the micro-heat sink 420 in the first switch module 400A. After the heat exchange in the first switch module 400A, the coolant flows from the micro-heat sink 420 in the first switch module 400A to the micro-heat sink 420 in the second switch module 400B. After the heat exchange in the second switch module 400B, the coolant flows from the micro-heat sink 420 in the second switch module 400B to the micro-heat sink 420 in the third switch module 400C. The coolant then flows back to the main distributor line 12 from the micro-heat sink 420 in the third switch module 400C after the heat exchange therein.

In this manner, numerous micro-heat sinks 120, 220, 320, 420, each of which is dedicated to one of numerous switch modules 100, 200, 300, 400 in the inverter, can be releasably connected to one another for fluid exchange at their respective coolant intakes 122, 222, 322, 422 and/or coolant outlets. This means that in arranging the numerous switch modules 100, 200, 300, 400, the different micro-heat sinks 120, 220, 320, 420 can be joined to one another at the coolant intakes 122, 222, 322, 422, or at the coolant outlets. They can also be disconnected if the switch modules 100, 200, 300, 400 are to be rearranged. This is of particular advantage with regard to greater scalability and more effective cooling of the inverter, because numerous switch modules 100, 200, 300, 400 can then be combined in a flexible manner with one another, and an effective cooling of the semiconductor switches can still be obtained independently of the number and arrangement of the switch modules 100, 200, 300, 400 as a result of the micro-heat sinks 120, 220, 320, 420 in each switch module 100, 200, 300, 400.

Figure 6A:
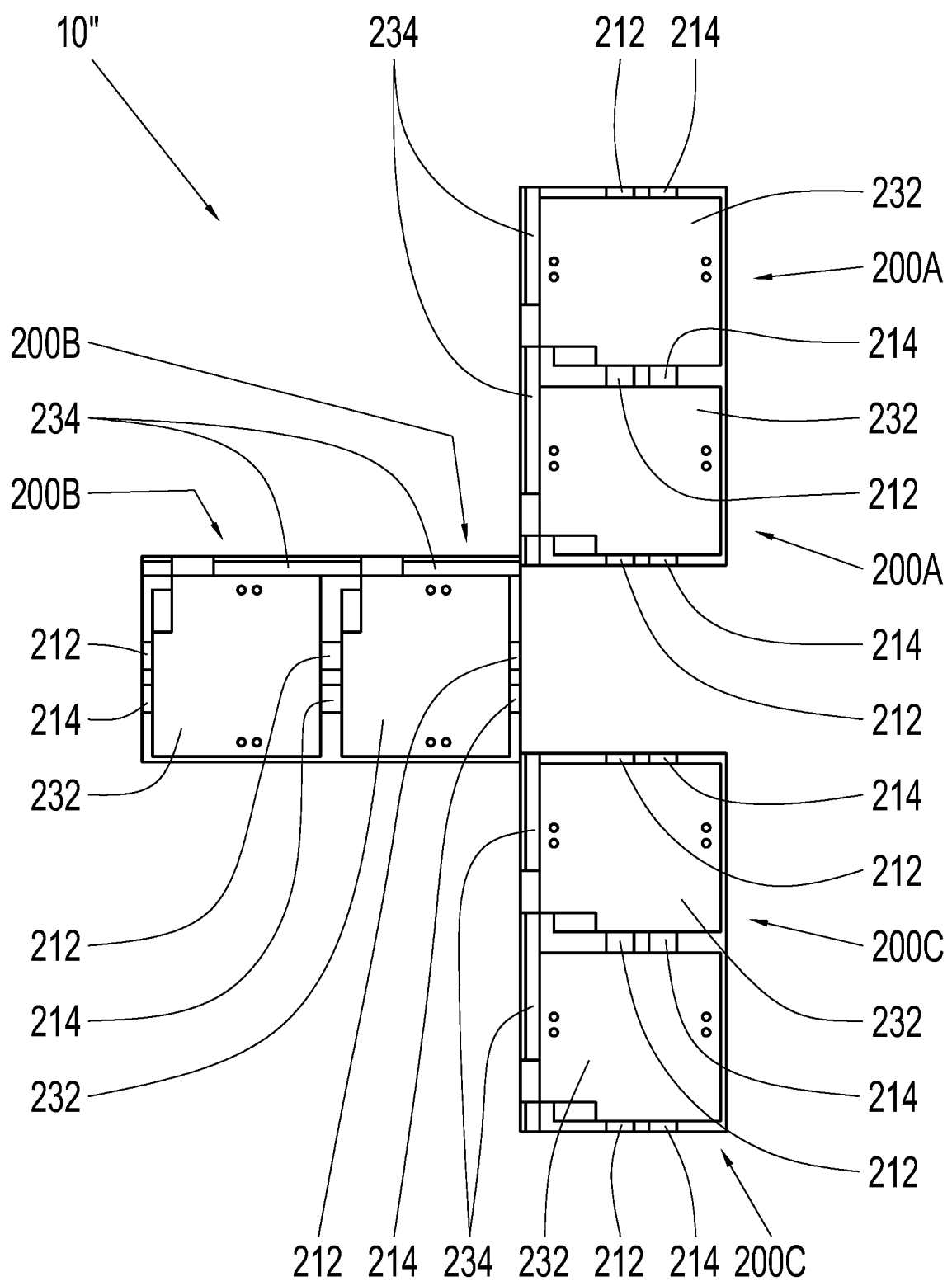
FIGS. 6A, 6B, and 6C show schematic illustrations of an inverter according to three different embodiments, in which numerous switch modules are arranged in a sequence or at an angle to one another.
Figures 6B, 6C:
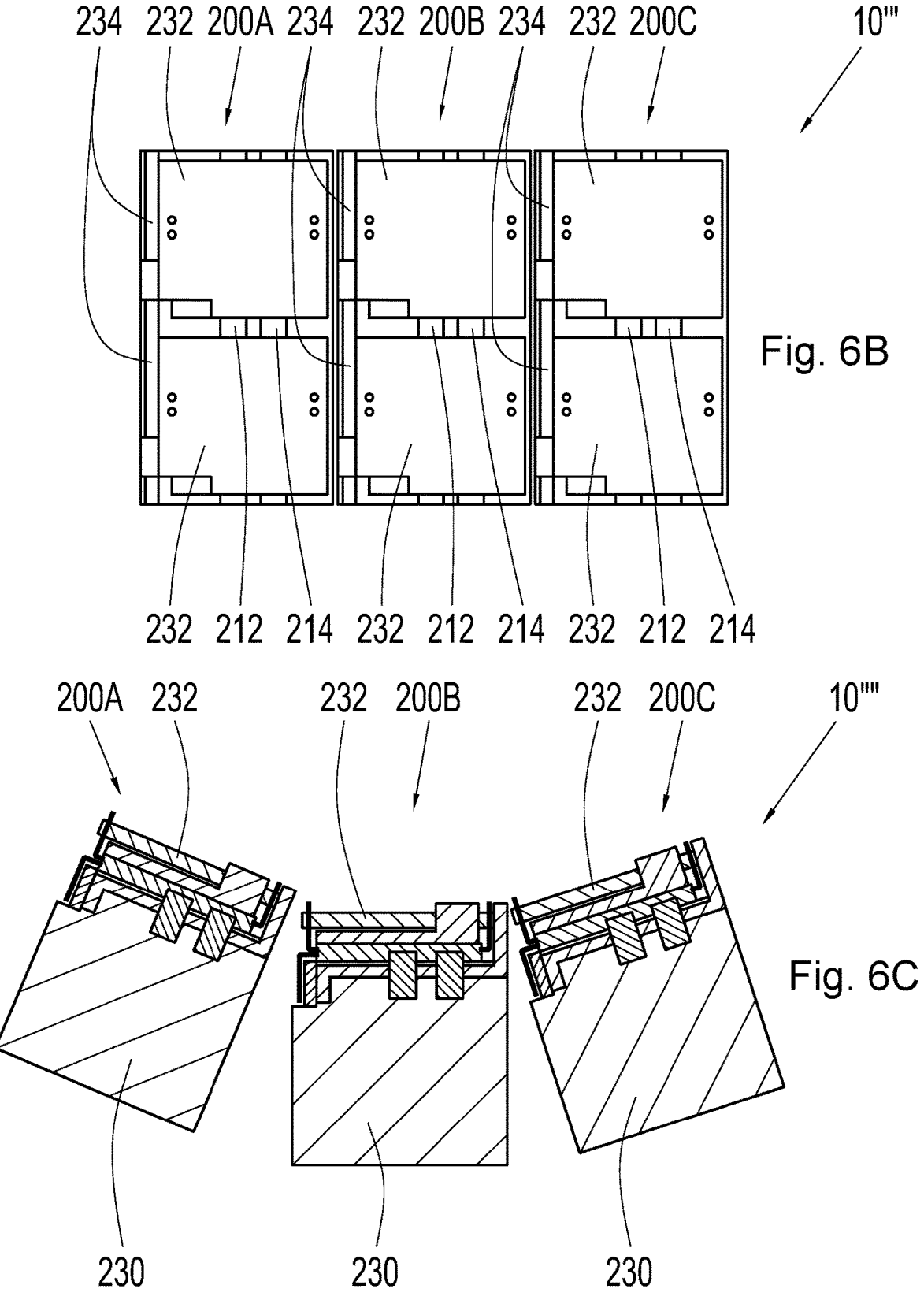

FIGS. 6A-C each show a way of arranging the switch modules 200A-C in an inverter 10", 10''', 10''''. The inverter 10", 10''' is shown from above in FIGS. 6A and 6B, and the inverter 10'''' is shown from the side in FIG. 6C. In all of the embodiments, the switch modules 200A-C are each arranged in three groups in which each group is assigned to one of numerous phase currents of the AC output. There are two switch modules 200A-C in each group, in which the positive DC input contacts 212 of each switch module 200A-C are electrically connected to one another, and the negative DC input contacts 214 of each switch module 200A-C are electrically connected to one another. In the embodiment shown in FIG. 6A, adjacent groups are rotated 90° to one another with respect to their longitudinal axes. In the embodiment shown in FIG. 6B, all three groups are arranged in a row. In the embodiment shown in FIG. 6C, adjacent groups are at an angle to one another with respect to their vertical axes.

REFERENCE SYMBOLS

10, 10', 10", 10''', 10'''' inverter
11, 13 arrow indicating a direction of flow for the coolant
12 main distributor line
14, 16, 18 distributor outputs
100, 200, 300, 400 switch modules
112, 212, 312, 412 positive DC input contacts
114, 214, 314, 414 negative DC input contacts
116, 216, 316, 416 AC output contacts
118, 218, 318, 418 casting compound
120, 220, 320, 420 micro-heat sink
122, 222, 322, 422 coolant intake
124, 224, 324, 424 cooling channel structure
126, 226, 326, 426 distributor segment
128, 228, 328, 428 cooling channel
130, 230, 330, 430 intermediate circuit capacitor
132, 232, 332, 432 driver printed circuit board
136, 236, 336, 436 signal line

The invention claimed is:

1. A switch module for an inverter for supplying electricity to an electric drive in an electric vehicle or hybrid vehicle, comprising:
  a high-side switch and a low-side switch, each of which has at least one semiconductor switch that are attached to a flat substrate;
  a DC input connection comprising a positive DC input contact and a negative DC input contact, wherein the DC input connection is configured to supply a DC input from a DC power source to the high-side switch and the low-side switch;
  an AC output connection configured to output an AC phase current of a multi-phase AC output, which is generated by activating the high-side switch and low-side switch on a basis of the DC input;
  a micro-heat sink comprising a coolant intake, a coolant outlet, and a connecting cooling channel structure between the coolant intake and the coolant outlet, wherein the micro-heat sink is configured to be releasably connected to at least one of a plurality of other micro-heat sinks, each of which are dedicated to one of a plurality of other switch modules in the inverter and can be releasably connected to one another for fluid exchange at their respective coolant intakes and/or coolant outlets,
  wherein the switch module further comprises a dedicated, separate driver printed circuit board, and
  wherein the cooling channel structure extends directly along the driver printed circuit board, between the substrate and the driver printed circuit board.

2. The switch module according to claim 1, wherein the cooling structure has a distributor segment that is perpendicular to a main plane of the switch module, which is defined by a surface of the substrate.

3. The switch module according to claim 2, wherein the cooling channel structure has one or more cooling channels that run parallel to a main plain of the switch module, which is defined by the flat substrate.

4. The switch module according to claim 2, further comprising a dedicated, separate intermediate circuit capacitor.

5. The switch module according to claim 2, further comprising an AC busbar configured to convey the AC phase current to the electric drive of the electric vehicle or hybrid vehicle,
  wherein numerous AC busbars, which are each dedicated to one of numerous switch modules in the inverter and the AC phase current of the AC output current, can be electrically connected to one another or formed integrally with one another.

6. The switch module according to claim 1, wherein the cooling channel structure has one or more cooling channels that run parallel to a main plain of the switch module, which is defined by the flat substrate.

7. The switch module according to claim 6, further comprising a dedicated, separate intermediate circuit capacitor.

8. The switch module according to claim 1, further comprising a dedicated, separate intermediate circuit capacitor.

9. The switch module according to claim 8, wherein the intermediate circuit capacitor is configured to be electrically connected to at least one of a plurality of other AC-intermediate circuit capacitors, each of which is dedicated to one of a plurality of other switch modules.

10. The switch module according to claim 9, wherein the cooling channel structure extends directly along the intermediate circuit capacitor, between the substrate and the intermediate circuit capacitor.

11. The switch module according to claim 8, wherein the cooling channel structure extends directly along the intermediate circuit capacitor, between the substrate and the intermediate circuit capacitor.

12. The switch module according to claim 1, wherein a distributor segment of the cooling channel structure extends at an edge region of the driver printed circuit board in a direction perpendicular to a main plane of the switch module, which is defined by the flat substrate.

13. The switch module according to claim 12, wherein a plurality of cooling levels of the cooling channel structure extend in a direction parallel to the main plane in the switch module from the distributor segment.

14. The switch module according to claim 1, further comprising an AC busbar configured to convey the AC phase current to the electric drive of the electric vehicle or hybrid vehicle,
  wherein numerous AC busbars, which are each dedicated to one of numerous switch modules in the inverter and the AC phase current of the AC output current, can be electrically connected to one another or formed integrally with one another.

15. The switch module according to claim 14, wherein the cooling channel structure extends directly along the AC busbar.

16. An inverter for supplying electricity to an electric drive in an electric vehicle or hybrid vehicle, comprising:
a plurality of switch modules according to claim 1.

17. The inverter according to claim 16, wherein a main plane of each of the plurality of switch modules, which are defined by the flat substrates of the plurality of switch modules, are arranged perpendicular, parallel, or at an angle, to one another.

18. A switch module for an inverter for supplying electricity to an electric drive in an electric vehicle or hybrid vehicle, comprising:
a high-side switch and a low-side switch, each of which has at least one semiconductor switch that are attached to a flat substrate;
a DC input connection comprising a positive DC input contact and a negative DC input contact, wherein the DC input connection is configured to supply a DC input from a DC power source to the high-side switch and the low-side switch;
an AC output connection configured to output an AC phase current of a multi-phase AC output, which is generated by activating the high-side switch and low-side switch on a basis of the DC input;
a micro-heat sink comprising a coolant intake, a coolant outlet, and a connecting cooling channel structure between the coolant intake and the coolant outlet,
wherein the micro-heat sink is configured to be releasably connected to at least one of a plurality of other micro-heat sinks, each of which are dedicated to one of a plurality of other switch modules in the inverter and can be releasably connected to one another for fluid exchange at their respective coolant intakes and/or coolant outlets, wherein the switch module further comprises a dedicated, separate intermediate circuit capacitor, and
wherein the cooling channel structure extends directly along the intermediate circuit capacitor, between the substrate and the intermediate circuit capacitor.

19. A switch module for an inverter for supplying electricity to an electric drive in an electric vehicle or hybrid vehicle, comprising:
a high-side switch and a low-side switch, each of which has at least one semiconductor switch that are attached to a flat substrate;
a DC input connection comprising a positive DC input contact and a negative DC input contact, wherein the DC input connection is configured to supply a DC input from a DC power source to the high-side switch and the low-side switch;
an AC output connection configured to output an AC phase current of a multi-phase AC output, which is generated by activating the high-side switch and low-side switch on a basis of the DC input;
a micro-heat sink comprising a coolant intake, a coolant outlet, and a connecting cooling channel structure between the coolant intake and the coolant outlet,
wherein the micro-heat sink is configured to be releasably connected to at least one of a plurality of other micro-heat sinks, each of which are dedicated to one of a plurality of other switch modules in the inverter and can be releasably connected to one another for fluid exchange at their respective coolant intakes and/or coolant outlets,
wherein the switch module further comprises an AC busbar configured to convey the AC phase current to the electric drive of the electric vehicle or hybrid vehicle, and
wherein the cooling channel structure extends directly along the AC busbar.

* * * * *